United States Patent
Chang et al.

(10) Patent No.: US 6,303,448 B1
(45) Date of Patent: Oct. 16, 2001

(54) METHOD FOR FABRICATING RAISED SOURCE/DRAIN STRUCTURES

(75) Inventors: Shou-Zen Chang, Hsin-Chu; Chao-Chieh Tsai, Taichung, both of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/187,303

(22) Filed: Nov. 5, 1998

(51) Int. Cl.[7] .................................................. H01L 21/336
(52) U.S. Cl. ........................ 438/300; 438/586; 438/589
(58) Field of Search .................................. 438/270, 259, 438/257, 430, 199, 275, 589, 300, 586

(56) References Cited

U.S. PATENT DOCUMENTS

| | | | |
|---|---|---|---|
| 4,839,306 | * 6/1989 | Wakamatsu . | |
| 5,049,515 | 9/1991 | Tzeng | 437/43 |
| 5,079,180 | 1/1992 | Rodden et al. | 437/44 |
| 5,198,378 | 3/1993 | Rodder et al. | 437/192 |
| 5,312,768 | 5/1994 | Gonzalez | 437/40 |
| 5,371,024 | * 12/1994 | Hieda et al. . | |
| 5,434,093 | * 7/1995 | Chau et al. . | |
| 5,489,543 | * 2/1996 | Hong . | |
| 5,538,913 | * 7/1996 | Hong . | |
| 5,576,227 | * 11/1996 | Hsu . | |
| 5,641,694 | 6/1997 | Kenney | 438/156 |
| 5,665,619 | * 9/1997 | Kwan et al. . | |
| 5,672,530 | 9/1997 | Hsu | 437/44 |
| 5,736,435 | * 4/1998 | Venkatesan et al. . | |
| 5,801,075 | * 9/1998 | Gardner et al. . | |
| 5,817,558 | * 10/1998 | Wu . | |
| 5,818,098 | * 10/1998 | Davies et al. . | |
| 5,918,132 | * 6/1999 | Qian et al. . | |
| 5,937,297 | * 8/1999 | Peidous . | |
| 5,953,602 | * 9/1999 | Oh et al. . | |
| 5,972,754 | * 10/1999 | Ni et al. . | |
| 5,998,288 | * 12/1999 | Gardner et al. . | |
| 6,025,232 | * 2/2000 | Wu et al. . | |

* cited by examiner

Primary Examiner—John F. Niebling
Assistant Examiner—Lynne A. Gurley
(74) Attorney, Agent, or Firm—George O. Saile; Stephen B. Ackerman

(57) ABSTRACT

The present invention provides a method for fabricating elevated and drain structures on a substrate. A first insulating layer is formed over a silicon substrate. A first barrier layer is formed over the first insulating layer. The first barrier layer, the first insulating layer and the substrate are patterned to form a trench. Ions are implanted into the substrate in the trench. A gate oxide layer is formed on the substrate in the trench. A polysilicon layer is deposited over the gate oxide layer and the barrier layer. The polysilicon layer is planarized using a chemical mechanical polishing process (CMP) stopping on the barrier layer to form a novel recessed gate. The barrier layer and the first insulating layer are removed. Lightly doped source/drain regions (LDD) are formed adjacent to the recessed gate. Spacers are formed on the sidewalls of the recessed gate. Source and drain regions are formed adjacent to the spacers. Salicide layers are formed on the source and drain regions and on the top of the recessed gate.

12 Claims, 2 Drawing Sheets

METHOD FOR FABRICATING RAISED SOURCE/DRAIN STRUCTURES

BACKGROUND OF INVENTION

1) Field of the Invention

This invention relates generally to fabrication of semiconductor devices and more particularly to the fabrication of elevated source and drain structures.

2) Description of the Prior Art

Under current MOSFET technology, raised source/drain regions are used in order to provide a transister having ultra-shallow junctions. Short channel effects increase as the source/drain depth increases, with respect to the gate oxide/silicon substrate interface. In order to minimize the source/drain depth raised source/drain regions are formed, typically using an epitaxial silicon process. The epitaxial growth of raised source/drain regions in MOSFET fabrication gives rise to numerous problems. The epitaxial growth of source and drain regions leaves facets or voids at the interfaces with the spacers formed adjacent to the gate and the interfaces with the field oxide regions. During the salicide process, silicide spikes are formed into these facets causing junction leakage. Another problem with the epitaxial growth of raised source/drain regions is diffusion of junction or lightly doped drain region (LDD) impurities during epitaxial growth. Yet another problem with epitaxial growth of raised source/drain regions is poor robustness and process yield due to difficulty controlling the thickness of the epitaial layer. Finally, the epitaxial growth of raised source/drain regions is an expensive process.

An alternative approach is disclosed by U.S. Pat. Nos. 5,079,180 & 5,198,378 (Rodder), whereby a thin spacer is formed adacent to the gate to allow for ion implant (I/I) after epitaxial growth of raised source/drain regions, while still allowing for sufficient horizontal migration of impurity ions to underlap the gate oxide. These patents also discloses formation of additional spacers in the abovementioned facets. This process does not solve the robustness issue caused by poor control of the thickness of the epitaxial layer nor does it alleviate the expense of epitaxial growth of raised source/drain regions. Also, this process relies on a timed etch in forming the additional spacers, again introducing a robustness issue as this process is also difficult to control.

Another alternative approach is disclosed by U.S. Pat. No. 5,312,768 (Gonzolez), whereby a layer of titanium nitride is deposited over the source/drain regions which acts as a barrier to impurity (phosphorous or boron) outdiffusion. However, this process requires additional photo masks and a sputtering process which are expensive and complicated and reduce yields.

Yet another alternative approach is disclosed by U.S. Pat. No. 5,672,530 (Hsu), whereby raised polycrystalline silicon regions are deposited on previously deposited insulating layers, however this process is complicated and expensive due to numerous photo masking and etching steps. Also, the multiple photo masking and etching steps cause control and yield problems.

Alternatively, U.S. Pat. No. 5,641,694 (Kenney) shows a SIO transistor formed in a trench with the source and drain regions on the sidewalls.

U.S. Pat. No. 5,049,515 (Tzeng) shows an EEPROM having a drain region formed in a trench.

The importance of overcoming the various deficiencies noted above is evidenced by the extensive technological development directed to the subject, as documented by the relevant patent and technical literature. The closest and apparently more relevant technical developments in the patent literature can be gleaned by considering the aforementioned US patents.

SUMMARY OF THE INVENTION

It is an object of the present invention to acheive the performance advantages of ultra-shallow juntions in MOSFET devices.

It is another object of the present invention to reduce or eliminate juntion leakage problems associated with the salicide process on devices having ultra-shallow junctions.

It is another object of the present invention to reduce or eliminate the impurity ion diffusion problem associated with an epitaxial process.

It is another object of the present invention to eliminate the need for pre-amorpization of the polysilicon in the source/drain regions.

It is another object of the present invention to provide an economical and robust process for manufacturing MOSFET devices.

It is yet another object of the present invention to reduce resistance by implanting deeper LDD region while maintaining the performance advantages of ultra-shallow junctions.

To accomplish the above objectives, the present invention provides a method for fabricating elevated and drain structures on a substrate. The process begins by forming a first insulating layer (12) over a silicon substrate (10). A first barrier layer (14) is formed over the first insulating layer (12). A photoresist mask (16) having a first opening (20) is formed over the first barrier layer (14). The first barrier layer (14), the first insulating layer (12) and the silicon substrate (10) are dry etched through the first opening (20) in the photoresist mask (16) to form a trench (50) having the silicon substrate (10) as its bottom surface. Ions are implanted into the substrate (10) in the trench (50). Optionally, a second sacrificial oxide layer (60) can be formed, then removed to round sharp corners in the substrate (10) in the trench (50). A gate oxide layer (62) is formed on the substrate (10) in the trench (50). A polysilicon layer (64) is formed over the gate oxide layer (62) and the barrier layer (14). The polysilicon layer (64) is planarized using a chemical mechanical polishing process (CMP) to form a novel recessed gate (64A). The barrier layer can act as a CMP stop. The barrier layer (14) is removed by a selective etching process. The first insulating layer (12) is removed by a selective etching process. Lightly doped source/drain regions (LDD) (66) are formed adjacent to the recessed gate (64A). Spacers (68) are formed on the sidewalls of the recessed gate (64A). Source and drain regions (70) are formed adjacent to the spacers (68). Salicide layers (72,74) are formed on the source and drain regions (70) and on the top of the recessed gate (64A).

BENEFITS

The junction leak problem typical of salicided ultra-shallow juctions can be reduced because there are no voids in which salicide spikes can form into the substrate. In the prior art, epitaxial groxth of raised source/drain regions results in facets. In the present invention the source/drain are formed in the substrate, which is raised with respect to the gate because of the novel recessed gate.

By raising the source/drain regions with respect to the novel recessed gate, additional disadvantages of the epitaxial process are avoided. The impurity ion diffusion problem associated with an epitaxial process is reduced. The need for pre-amorpization of the polysilicon in the source/drain regions is eliminated. Additional, expensive, photo-masking steps and timed etching steps are avoided.

The novel recessed gate allows the present invention to reduce resistance by implanting thicker LDD regions while maintaining the performance advantages of ultra-shallow junctions. These thicker LDD regions allow a thicker silicide to be formed while still maintaining a sufficient distance between the silicide and the channel.

The present invention achieves these benefits in the context of known process technology. However, a further understanding of the nature and advantages of the present invention may be realized by reference to the latter portions of the specification and attached drawings. Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the appended claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method of forming a MOSFET device with raised source/drain relative to the gate dielectric.

Figure 1:
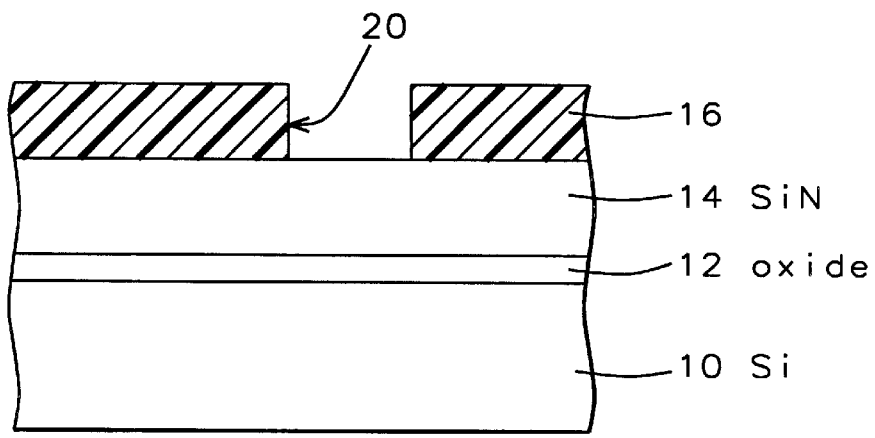
FIGS. 1, 2, 3, 4, 5 & 6 illustrate sequential sectional views of a raised source/drain MOSFET device with novel recessed gate.

Referring to FIG. 1, the process begins by forming a first insulating layer (12) over a silicon substrate (10). The first insulating layer (12) is preferably composed of silicon oxide ($SiO_2$) having a thickness in a range between about 70 Å and 110 Å with a target thickness of 100 Å. The first insulating layer can be formed using a chemical vapor deposition process (CVD) or preferably using a thermal oxidation process as is well known in the art.

Still referring to FIG. 1, a first barrier layer (14) is formed over the first insulating layer (12). The first barrier layer (14) can be composed of silicon nitride ($Si_3N_4$) or silicon oxynitride (SiON). The first barrier layer (14) is preferably composed of silicon nitride having a thickness in the range between about 1500 Å and 2500 Å. The combined thickness of first insulating layer (12) and the first barrier layer (14) determining the height of the polysilicon gate to be formed during future processing.

The silicon nitride layer can be formed by reacting silane and ammonia at atmospheric pressure at 700° C. to 900° C., or by reacting dichlorosilane and ammonia at reduced pressure at approximately 700° C. (LPCVD). Also, silicon nitride can be formed by plasma enhanced chemical vapor deposition by reacting silane with ammonia or nitrogen in a glow discharge between 200° C. and 350° C. The first nitride layer is preferably formed using a LPCVD process.

As shown in FIG. 1, a photoresist mask (16) is formed over the first barrier layer (14). The photoresist mask (16) is patterned using conventional photolithography as is well known in the art. The photoresist mask (16) is patterned to form a first opening (20) defining a gate area.

Figure 2:
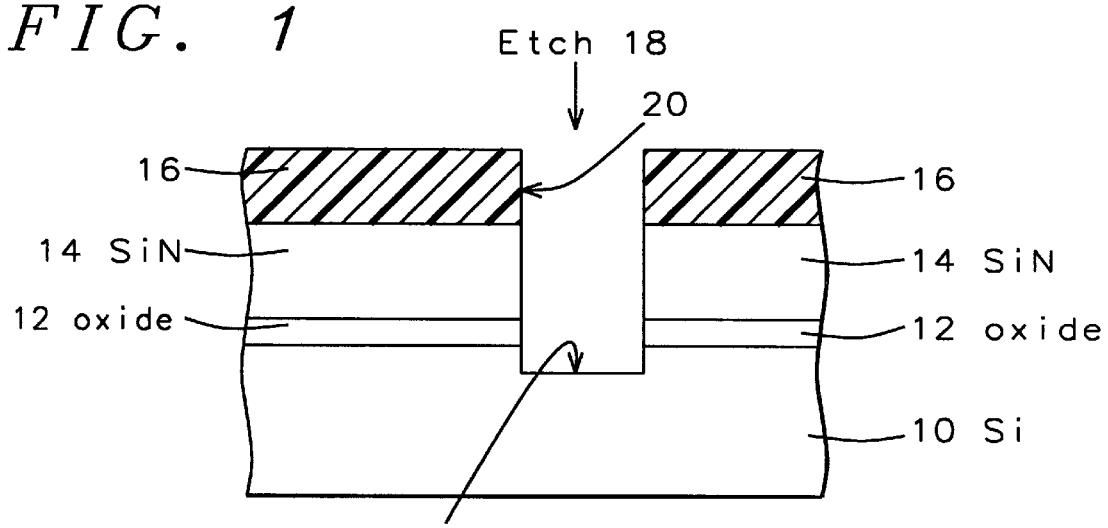

Referring to FIG. 2, the first barrier layer (14) and the first insulating layer (12) are removed through the first opening (20) by dry etching. The dry etch also forms a trench (50) in the silicon substrate (10) in the area of the first opening (20). This etch can be performed using $CF_4+O_2$ as the source gas in the "plasma etch" mode. Alternately, the etch can be performed by changing the reaction gasses (e.g. etch SiN stopping on SiO, etch SiO stopping on Si, then use a timed etch for Si). The trench (50) in the substrate (10) is etched to a depth between about 0.05 µm and 0.07 µm, with a target of 0.6 µm.

Figure 3:
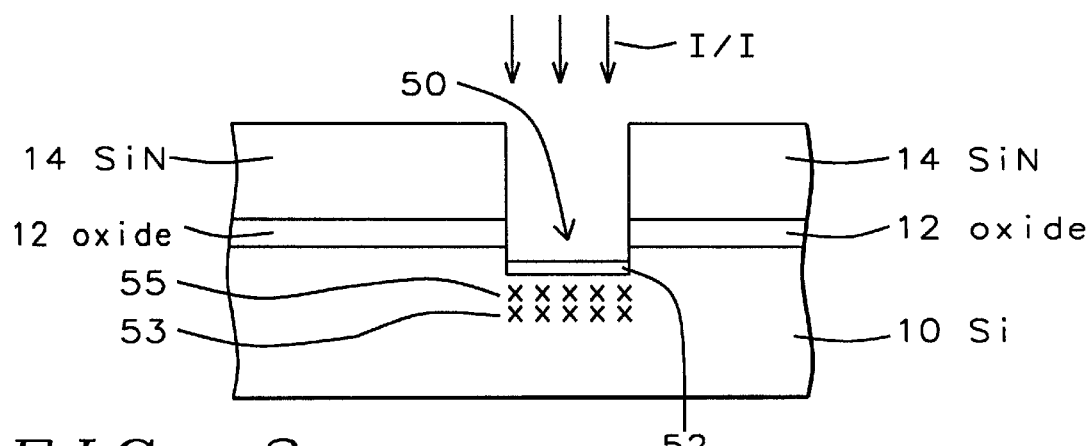

Referring to FIG. 3, the photoresist mask (16) is removed. Then a lining oxide layer (52) is formed in the trench (50), and ions are implanted into the substrate (10). The lining oxide layer can be formed by thermal oxidation or preferably by CVD, having a thickness in a range between about 50 Å and 200 Å. Ions are implanted through the lining oxide layer (52) into the substrate (10) in the trench (50) to form anti-punch through (APT) (53) and threshhold voltage adjust (VT) (55). For an NAPT "B" ions are implanted at an energy of between about 70 KeV and 100 KeV at a dose of between about 1.0E13 atm/$cm^2$ and 3.0E13 atm/$cm^2$. For a PAPT, "As" ions are implanted at an energy of between about 200 KeV and 250 KeV at a dose of between about 1.0E13 atm/$cm^2$ and 2.0E13 atm/$cm^2$, or "P" ions are implanted at an energy between about 120 KeV and 140 KeV at a dose between about 1.0E13 atm/$cm^2$ and 2.0E13 atm/$cm^2$. The APT is preferably implanted at a depth between 2000 Å and 2500 Å. For VTN, "B" ions are implanted at an energy between about 20 KeV and 30 KeV at a dose of between 2.0E12 atm/$cm^2$ and 5.0E12 atm/$cm^2$. For VTP, "As" ions are implanted at an energy of between 40 KeV and 50 KeV at a dose of between about 2.0E12 atm/$cm^2$ and 5.0 atm/$cm^2$.

Figure 4:
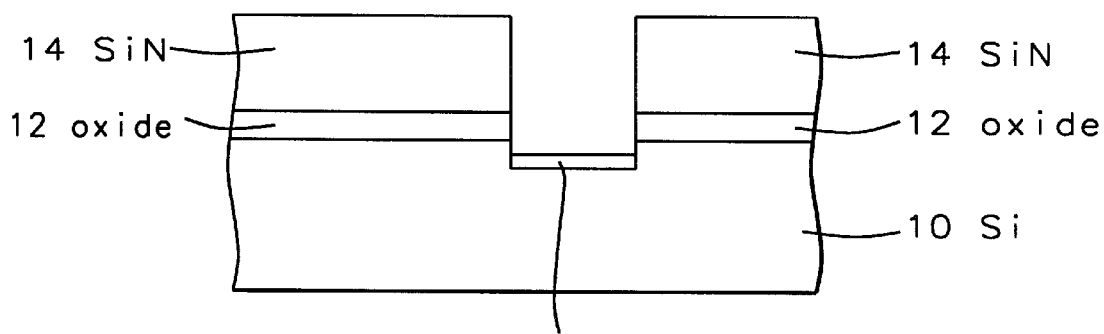

Referring to FIG. 4, the lining oxide layer (52) is removed. Typically the lining oxide layer is removed by a wet etch. An optional second sacrificial oxide layer (60) can be formed then removed to round sharp corners in the substrate (10) at the bottom of the trench (50).

Figure 5:
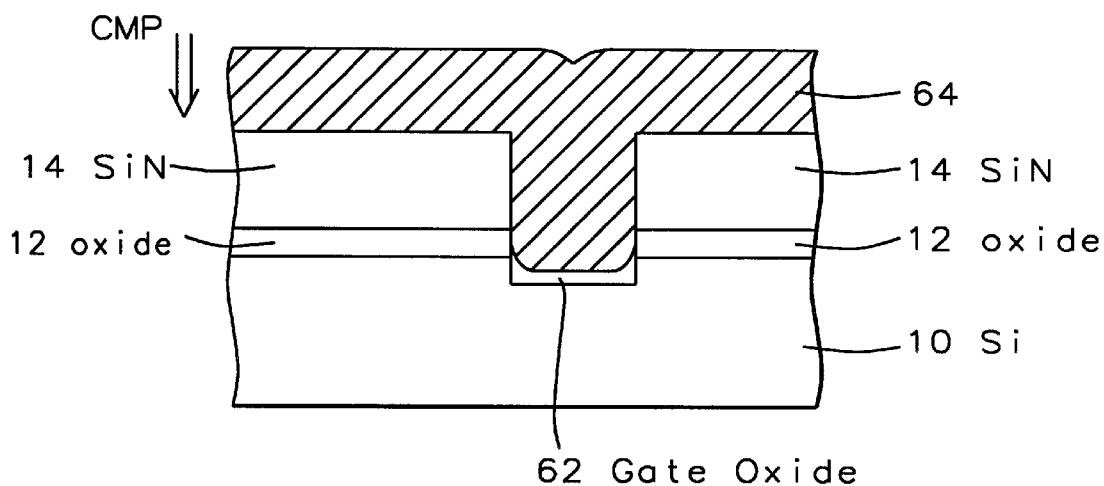

Referring to FIG. 5, a gate oxide layer (62) is formed in the trench (50) on the substrate (10). The gate oxide is preferably formed to a thickness in a range between 32 Å and 50 Å by thermal oxidation in an oxygen-steam ambient, at a temperature between about 850° C. and 1000° C.

Still referring to FIG. 5, a polysilicon layer (64) is formed on the gate oxide layer (62) and the barrier layer (14). The polysilicon layer is preferably formed by LPCVD, at a temperature between about 600° C. and 800° C. to a thickness in a range between 3000 Å and 5000 Å.

Figure 6:
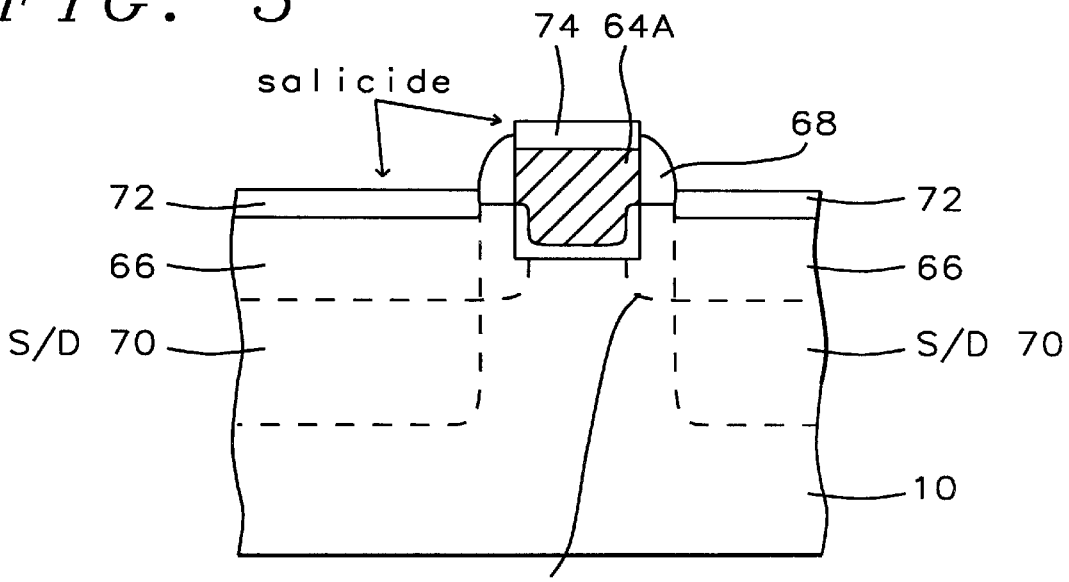

Referring to FIG. 6, the polysilicon layer (64) is planarized using a chemical mechanical polishing process (CMP). The CMP is conducted to a point of stopping on the top surface of the barrier layer (14) to form a novel recessed gate (64A) having a thickness of between about 2000 Å and 3000 Å. The recessed gate has sidewalls and a top.

Still referring to FIG. 6, the barrier layer (14) is removed by an etching process selective to silicon nitride over polysilicon. The first insulating layer (12) is removed by an etching process selective to silicon dioxide over polysilicon and silicon.

Still referring to FIG. 6, lightly doped source/drain regions (LDD) (66) are formed by ion implantation. The implant ions are preferably arsenic, implanted at an energy in a range between about 15 KeV and 30 KeV, at a dose in a range between about $5.0E14$ atm/cm$^2$ and $1.0E15$ atm/cm$^2$ for an N-type LDD. For a P-type LDD, boron ions are preferably implanted at an energy in a range between about 10 KeV and 25 KeV, at a dose in a range between about $1.0E14$ atm/cm$^2$ and $3.0E14$ atm/cm$^2$. Because of the novel recessed gate (64A), the LDD regions can be implanted deeper than than in conventional ultra-shallow juntion devices to a depth in a range between 1200 Å and 1500 Å, thereby reducing resistance without adverse short channel effects or reduced breakdown voltage.

The inventors have determined that for a LDD, a shallow junction depth of 0.06 μm to 0.08 μm is necessary for short channel effect suppression. Since the gate region is recessed a depth of about 0.06 μm in the present invention, the shallow junction depth can be increased to between about 0.12 μm and 0.14 μm.

Still referring to FIG. 6, spacers (68) are formed on the sidewalls of the recessed gate (64A). The spacers are preferably composed of silicon oxide at a thickness in a range between 1000 Å and 1500 Å. The spacers can be formed using a LPCVD process or using a plasma enhanced chemical vapor deposition (PECVD) process at a temperature between about 300° C. and 800° C. after a LPCVD layer about 100 Å thick is formed. The spacers are formed by an anisotropic reactive ion etch (REI) selective to silicon oxide over polysilicon, such as $CHF_3$ or $CF_4$—$O_2$. Alternatively, the spacers (68) can be composed of silicon nitride, formed to a thickness between 1000 Å and 1500Å using a LPCVD process and anisotropically etching.

Source/Drain regions (70) are formed adjacent to the spacers (68) by ion implantation. The implant ions are preferably As ions, implanted at an energy in a range between about 40 KeV and 70 KeV, at a dose in the range between about $3.0E15$ and $5.5E15$ atm/cm$^2$ or B ions, implanted at an energy in the range between about 3.0 KeV and 5.0 KeV, at a dose in a range between about $3.0E15$ and $5.5E15$ atm/cm$^2$.

Silicide layers (72,74) are formed on the source/drain regions (70) and on the top of the recessed gate (64A) using a salicide process. Surfaces are cleaned using a hydrofluoric acid treatment. Titanium is deposited to a thickness in a range between about 250 Å and 350 Å using a sputtering process. The titanium caused to react with exposed polysilicon using a rapid thermal anneal (RTA) process at a temperature between about 550° C. and 700° C., for a period of time in a range between about 10 and 30 seconds. Unreacted titanium is removed using a solution of $H_2O_2$—$H_2SO_4$.

While the invention has been particularly shown and described with reference to the preferred embodiments thereof, it will be understood by those skilled in the art that various changes in form and details may be made without departing from the spirit and scope of the invention.

What is claimed is:

1. A method for fabricating elevated source and drain regions on a substrate comprising the steps of:
    a) forming a first insulating layer over a silicon substrate and forming a first barrier layer over said first insulating layer;
    b) patterning said barrier layer, said first insulating layer and said silicon substrate to form a trench;
    c) forming a gate oxide layer on said substrate in said trench;
    d) depositing a polysilicon layer over said gate oxide layer and said barrier layer;
    e) planarizing said polysilicon layer using a chemical-mechanical polishing process; said chemical-mechanical polish stopping on said barrier layer to form a recessed gate; said recessed gate having sidewalls and a top;
    f) removing all of said barrier layer and said first insulating layer; and
    g) implanting impurity ions to form elevated source and drain regions adjacent to said recessed gate.

2. The method of claim 1 wherein said trench extends a depth of between 0.05 μm and 0.07 μm into said substrate.

3. The method of claim 1 which further includes prior to forming said gate oxide layer, forming and removing a second sacraficial oxide layer to round the corners of said trench.

4. The method of claim 1 which further includes prior to forming said source and drain regions forming lightly doped drain regions at a depth of between 1200 Å and 1500 Å below the top of the substrate surface.

5. A method for fabricating elevated source and drain structures on a substrate comprising the steps of:
    a) forming a first insulating layer over a silicon substrate;
    b) forming a first barrier layer over said first insulating layer;
    c) forming a photoresist mask over said first barrier layer; said photoresist mask having a first opening;
    d) dry etching said barrier layer, said first insulating layer and said silicon substrate through said photoresist mask to form a trench;
    e) removing said photoresist mask;
    f) forming a lining oxide layer on said substrate in said trench and implanting ions into said substrate;
    g) removing said lining oxide layer;
    h) forming a gate oxide layer on said substrate in said trench;
    i) depositing a polysilicon layer over said gate oxide layer and said barrier layer;
    j) planarizing said polysilicon layer using a chemical-mechanical polishing process; said chemical-mechanical polish stopping on said barrier layer to form a recessed gate; said recessed gate having sidewalls and a top;
    k) removing all of said barrier layer by a selective etching process;
    l) removing all of said first insulating layer by a selective etching process;
    m) implanting impurity ions to form lightly doped source and drain regions adjacent to said recessed gate;
    n) forming spacers on said sidewalls of said recessed gate; and
    o) implanting impurity ions to form source and drain regions adjacent to said spacers.

6. The method of claim 5 wherein said trench extends a depth of between 0.05 μm and 0.07 μm into said substrate.

7. The method of claim 5 which further includes prior to forming said gate oxide layer, forming and removing a second sacraficial oxide layer to round the corners of said trench.

8. The method of claim 5 wherein said lightly doped source and drain regions are formed to a depth of between 1200 Å and 1500 Å.

9. The method of claim 5 wherein said lightly doped source and drain regions are formed by implanting As ions with an energy between 15 KeV and 30 KeV at a dose of between 5.0E14 atm/cm$^2$ and 1.0E15 atm/cm$^2$.

10. The method of claim 5 wherein said lightly doped source and drain regions are formed by implanting B ions with an energy between 10 KeV and 25 KeV at a dose of between 1.0E14 atm/cm$^2$ and 3.0E14 atm/cm$^2$.

11. The method of claim 5 which further includes forming silicide layers on said source and drain regions and on said top of said recessed gate.

12. A method for fabricating elevated source and drain structures on a substrate comprising the steps of:

a) forming a first insulating layer over a silicon substrate;
   b) forming a first barrier layer over said first insulating layer;
   c) forming a photoresist mask over said first barrier layer; said photoresist mask having a first opening;
   d) dry etching said barrier layer, said first insulating layer and said silicon substrate through said photoresist mask to form a trench having a depth of between about 0.05 microns and 0.07 microns;
   e) removing said photoresist mask;
   f) forming a lining oxide layer on said substrate in said trench and implanting ions into said substrate;
   g) removing said lining oxide layer;
   h) forming a gate oxide layer on said substrate in said trench; said gate oxide layer having a thickness of between about 32 angstroms and 50 angstroms;
   i) depositing a polysilicon layer over said gate oxide layer and said barrier layer;
   j) planarizing said polysilicon layer using a chemical-mechanical polishing process; said chemical-mechanical polish stopping on said barrier layer to form a recessed gate having a thickness of between about 2000 angstroms and 3000 angstroms; said recessed gate having sidewalls and a top;
   k) removing all of said barrier layer by a selective etching process;
   l) removing said first insulating layer by a selective etching process;
   m) implanting impurity ions to form lightly doped source and drain regions adjacent to said recessed gate;
   n) forming spacers on said sidewalls of said recessed gate; and
   o) implanting As ions with an energy between 15 KeV and 30 KeV at a dose of between 5.0E14 atm/cm$^2$ and 1.0E15 atm/cm$^2$ to form source and drain regions adjacent to said spacers; and
   p) depositing a metal layer over said silicon substrate and annealing said metal layer to form silicide on said source and drain regions.

* * * * *